(12) United States Patent
Chu et al.

(10) Patent No.: US 9,891,537 B2
(45) Date of Patent: Feb. 13, 2018

(54) MASKLESS LITHOGRAPHIC APPARATUS MEASURING ACCUMULATED AMOUNT OF LIGHT

(71) Applicant: Samsung Electronics Co., Ltd., Suwon-si, Gyeonggi-do (KR)

(72) Inventors: Ji Young Chu, Gyeongju-si (KR); Shiva Ram Krishna, Suwon-si (KR); Tae Hyun Kim, Suwon-si (KR); Song Woo Bae, Seoul (KR); Sang Don Jang, Suwon-si (KR); Won Don Joo, Incheon (KR)

(73) Assignee: SAMSUNG ELECTRONICS, CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/348,173

(22) Filed: Nov. 10, 2016

(65) Prior Publication Data

US 2017/0261862 A1    Sep. 14, 2017

(30) Foreign Application Priority Data

Mar. 9, 2016 (KR) ........................ 10-2016-0028205

(51) Int. Cl.
*G03F 7/20* (2006.01)

(52) U.S. Cl.
CPC .......... *G03F 7/70391* (2013.01); *G03F 7/704* (2013.01); *G03F 7/7005* (2013.01); *G03F 7/70133* (2013.01); *G03F 7/70208* (2013.01); *G03F 7/70383* (2013.01); *G03F 7/70425* (2013.01); *G03F 7/70558* (2013.01)

(58) Field of Classification Search
CPC .............. G03F 7/70425; G03F 7/7005; G03F 7/70391; G03F 7/70133; G03F 7/70208; G03F 7/70383; G03F 7/704; G03F 7/70558; G03F 7/7085
See application file for complete search history.

(56) References Cited

U.S. PATENT DOCUMENTS

| 8,363,209 | B2 | 1/2013 | Shin et al. |
| 8,619,233 | B2 | 12/2013 | Sung |
| 8,804,098 | B2 | 8/2014 | Baek et al. |
| 9,046,779 | B2 | 6/2015 | Yun et al. |

(Continued)

FOREIGN PATENT DOCUMENTS

| KR | 2011-0061318 A | 6/2011 |
| KR | 2012-0100208 A | 9/2012 |

(Continued)

*Primary Examiner* — Michelle M Iacoletti
(74) *Attorney, Agent, or Firm* — Harness, Dickey & Pierce

(57) ABSTRACT

Maskless lithographic apparatus measuring accumulated amount of light is provided. The maskless lithographic apparatus includes a light source which emits light, a stage on which a substrate is disposed, an optical system which converts the light into a beam spot array including a plurality of columns and a plurality of rows and irradiates the beam spot array onto the stage, a slit to which the beam spot array is irradiated and which passes an nth (n is a natural number) row of the beam spot array, an optical sensor which senses the nth row of the beam spot array which has passed through the slit, and a measuring unit which measures an accumulated amount of light in the nth row of the beam spot array sensed by the optical sensor.

17 Claims, 14 Drawing Sheets

(56) References Cited

U.S. PATENT DOCUMENTS

| | | | |
|---|---|---|---|
| 2010/0208222 A1* | 8/2010 | Kim | G03B 27/42 355/53 |
| 2011/0157569 A1* | 6/2011 | Baek | G03B 27/52 355/55 |
| 2015/0177625 A1* | 6/2015 | De Boer | B82Y 40/00 355/67 |

FOREIGN PATENT DOCUMENTS

| | | |
|---|---|---|
| KR | 1374954 | 3/2014 |
| KR | 2014-0062600 A | 5/2014 |

* cited by examiner

MASKLESS LITHOGRAPHIC APPARATUS MEASURING ACCUMULATED AMOUNT OF LIGHT

CROSS-REFERENCE TO RELATED APPLICATION

This application claims priority from Korean Patent Application No. 10-2016-0028205 filed on Mar. 9, 2016 in the Korean Intellectual Property Office, the disclosure of which is incorporated herein by reference in its entirety.

BACKGROUND

1. Technical Field

Example embodiments of the present inventive concepts relate to a maskless lithographic apparatus and/or a method of measuring an accumulated amount of light using the same.

2. Description of the Related Art

Lithography generally uses light to transfer a geometric shape (i.e., pattern) on a mask to a thin photosensitive material (photoresist) coated on a surface of a substrate. In this case, a lithographic apparatus may be employed to engrave an actually designed pattern in the substrate coated with the photosensitive material by using a light source. The lithographic apparatus typically includes a mask (or a reticle, referred to as a mask hereinafter) which is an original plate with a designed pattern drawn thereon, an optical system which images a pattern of the mask onto a substrate, a transfer device which precisely aligns and moves the mask and the substrate, a light source which emits light having a wavelength that induces a photochemical reaction to a photosensitive material.

Recently, a maskless lithographic apparatus has attracted significant interest because maskless lithography may make easier the production of a large sized display panel and may eliminate the need for a costly mask.

When using a maskless lithographic apparatus, the maskless lithographic apparatus may require that an accumulated amount of light be uniform in a scanning direction of each beam spot so as to form a uniform pattern in an exposure region. However, it may be very time consuming to manually measure a distribution of the light quantity of beam spots and add up the same by switching on/off individual beam spot.

SUMMARY

Some example embodiments of the present inventive concepts provide a maskless lithographic apparatus capable of quickly detecting a change in an amount of light by measuring an accumulated amount of light of a specific row of a beam spot array which has passed through a slit.

Other example embodiments of the present inventive concepts provide a method for measuring an accumulated amount of light using a maskless lithographic apparatus capable of measuring an accumulated amount of light.

However, example embodiments of the present inventive concepts are not restricted to those set forth herein. Still other example embodiments of the present inventive concepts which are not mentioned herein will become more apparent to one of ordinary skilled in the art to which the present inventive concepts pertain by referencing the detailed description of the example embodiments of the present inventive concepts given below.

In one aspect of the example embodiments of the present inventive concepts, a maskless lithographic apparatus includes a light source which emits light, a stage on which a substrate is disposed, an optical system which converts the light into a beam spot array including a plurality of columns and a plurality of rows and scans irradiates the beam spot array onto the stage, a slit to which the beam spot array is scanned irradiated and which passes an nth (n is a natural number) row of the beam spot array, an optical sensor which senses the nth row of the beam spot array which has passed through the slit, and a measuring unit which measures an accumulated amount of light in the nth row of the beam spot array sensed by the optical sensor.

In another example embodiment of the present inventive concepts, a maskless lithographic apparatus includes a light source which provides light, an optical system which converts and outputs the light into a matrix type beam spot array, a slit which passes a part of the beam spot array, a sensor which senses the part of the beam spot array which has passed through the slit and a measuring unit which measures an accumulated amount of light of the part of the beam spot array sensed by the sensor, wherein the slit includes grooves, and the grooves are arranged into a position corresponding to an nth (n is a natural number) row of the beam spot array.

In other example embodiment, a maskless lithographic apparatus includes an optical system configured to convert light into a beam spot array including a plurality of rows and a plurality of columns, and to irradiate the beam spot array onto a sensor via a plate, the plate connected to a stage supporting a substrate thereon, the plate configured to pass a part of the beam spot array therethrough, the plate including grooves corresponding to a selected one of the plurality of rows of the beam spot array; and a processor configured to measure an accumulated amount of the light of the part of the beam spot array sensed by the sensor.

DETAILED DESCRIPTION

Figure 1:
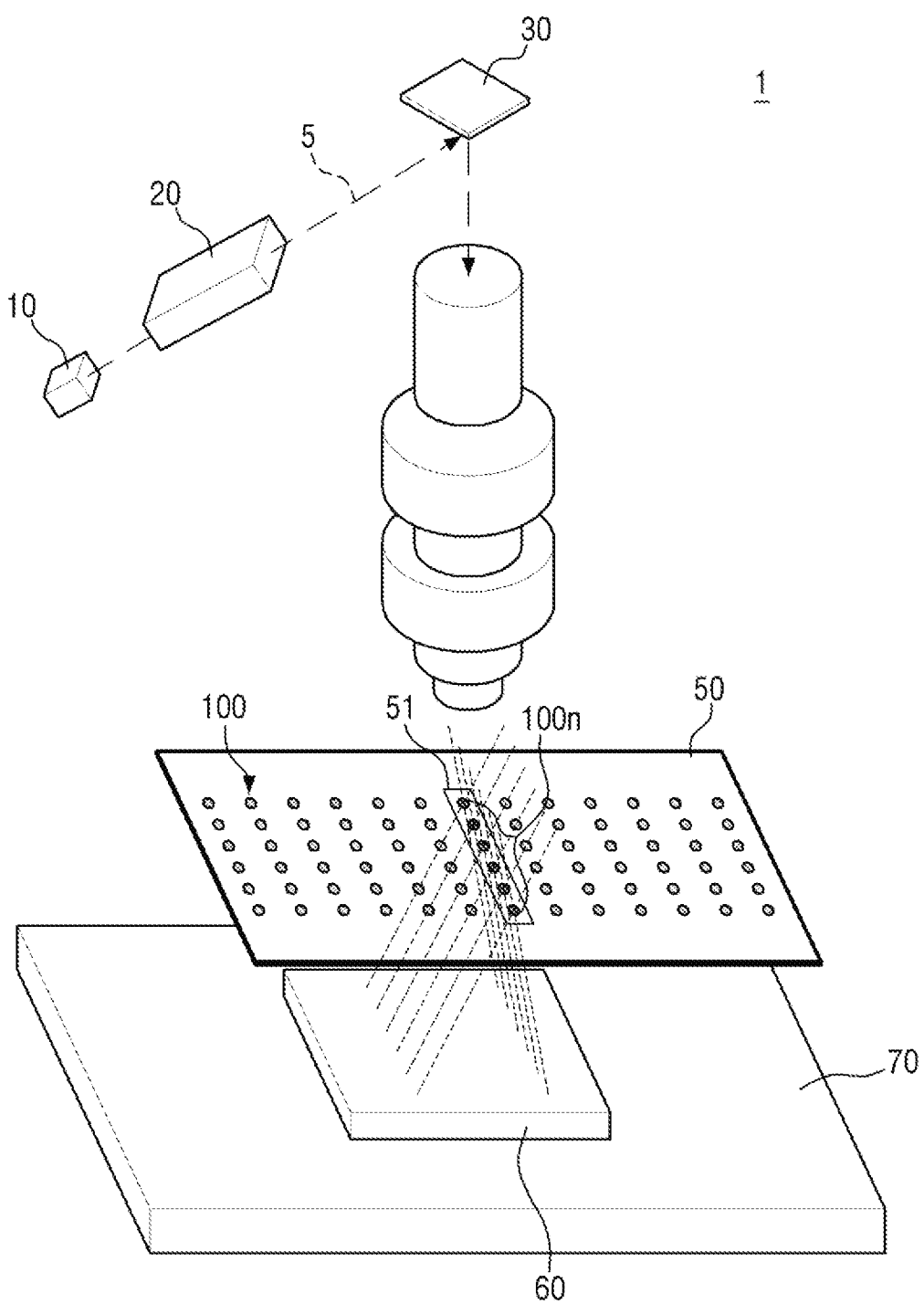
FIG. 1 is a perspective view illustrating a maskless lithographic apparatus according to one example embodiments of the present inventive concepts.
Figure 2:
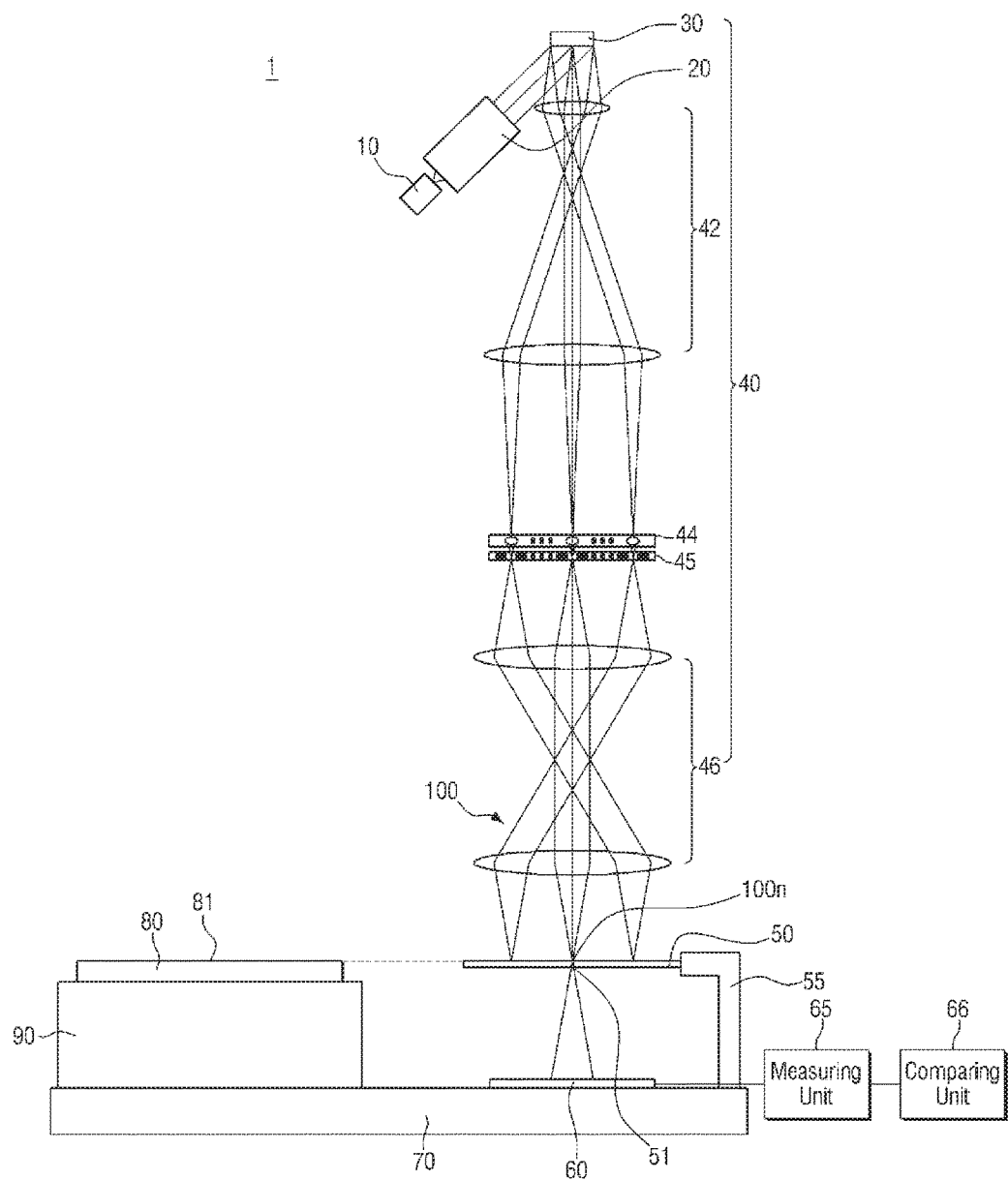
FIG. 2 is a cross-sectional view of the maskless lithographic apparatus shown in FIG. 1.

FIG. 1 is a perspective view illustrating a maskless lithographic apparatus according to one example embodiment of the present inventive concepts, and FIG. 2 is a cross-sectional view of the maskless lithographic apparatus shown in FIG. 1.

Referring to FIG. 1 and FIG. 2, a maskless lithographic apparatus 1 according to one example embodiment of the present inventive concepts may include a light source 10, an illumination optical system 20, a light modulator 30, an exposure optical system 40, a plate 50 (or, alternatively, referred to as a slit), an optical sensor 60, a stage 70, and a chuck 90 on which a substrate 80 may be disposed.

Figure 3:
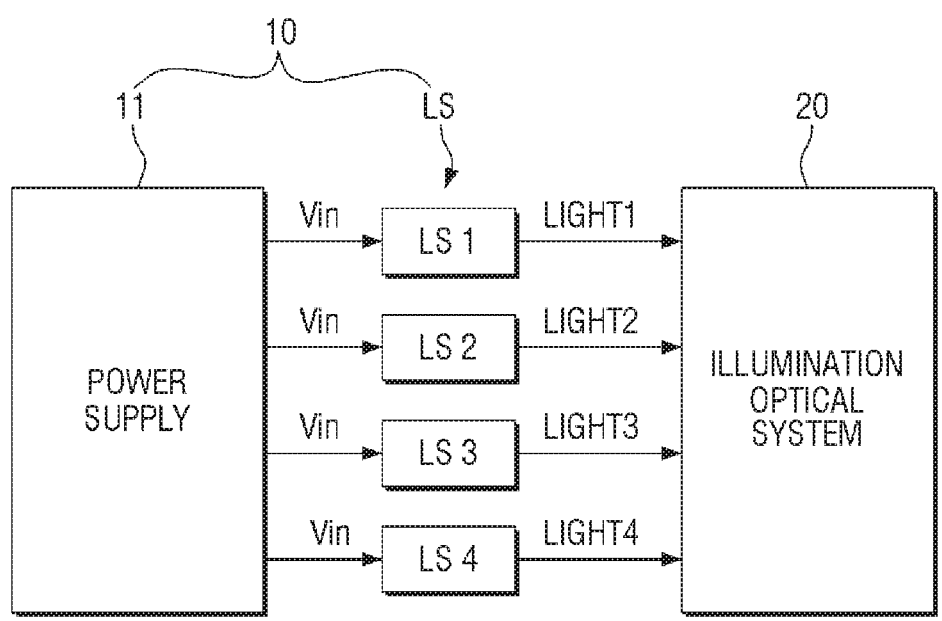
FIG. 3 illustrates a light source of the maskless lithographic apparatus shown in FIG. 1.

FIG. 3 illustrates a light source of the maskless lithographic apparatus shown in FIG. 1.

Referring to FIG. 3, the light source 10 may include an optical element LS and a power supply 11. The light source 10 may include a plurality of optical elements LS1 to LS4.

The optical element LS may be formed of a semiconductor laser, an ultraviolet lamp and the like. Hereinafter, the optical element LS will be described as a semiconductor laser.

The plurality of optical elements LS1 to LS4 may receive power input from the power supply 11. The voltage received from the power supply 11 to the plurality of optical elements LS1 to LS4 may vary in amplitude. That is, the power supply 11 may apply different voltages to the plurality of optical elements LS1 to LS4. However, example embodiments are not limited thereto, and the voltages supplied to the plurality of optical elements LS1 to LS4 from the power supply 11 may all be of the same amplitude.

Light emitted from the plurality of optical elements LS1 to LS4 may be applied to the illumination optical system 20. The illumination optical system 20 and the plurality of optical elements LS1 to LS4 may be interconnected by an optical fiber, but example embodiments are not limited thereto.

As shown in FIG. 3, the light source 10 may include four optical elements such as first to fourth optical elements LS1 to LS4, but example embodiments are not limited thereto. For example, the number of optical elements of the light source 10 may vary depending on the configuration of the lithographic apparatus.

Referring back to FIG. 1 and FIG. 2, the illumination optical system 20 may correct an exposure beam provided from the light source 10 to have a uniform illumination and emit a corrected exposure beam 5.

The light modulator 30 may include a spatial light modulator (SLM). Examples of the light modulator 30 may include a micro electro mechanical systems (MEMS) type digital micro-mirror device (DMD), a grating light valve (GLV), an electro-optical device using lead zirconate titantate (PLZT) that is translucent ceramic, and ferroelectric liquid crystal (FLC), and preferably, the DMD may be used as the light modulator 30. For convenience of explanation, it is assumed hereinafter that the light modulator 30 is a DMD.

The DMD may a device including a substrate, memory cells (for example, SRAM cells) formed on the substrate, and a plurality of micro-mirrors arranged in a matrix on the memory cells. For example, micro-mirrors may be arranged in 1024 columns and 768 rows. A highly reflective material such as aluminum may be deposited on a surface of each micro-mirror. In this case, the micro-mirrors may have a reflectivity of approximately 90%, and may be arranged at substantially equal pitch in row and column directions.

When a digital signal is applied to a memory cell of the DMD, a micro-mirror supported by a support unit may be tilted within a range of $\pm\alpha$ degree (for example, $\pm12$ degrees) with respect to a surface of the substrate. Thus, the corrected exposure beam 5 applied to the DMD may be reflected in a specific direction according to the tilt angle of each micro-mirror, by controlling the tilt angle of the micro-mirror of the DMD according to information in an exposure pattern.

The exposure optical system 40 may convert the modulated exposure beam delivered from the light modulator 30 into a beam spot array including a plurality of columns and rows. The exposure optical system 40 may include a first imaging optical system 42, a micro-lens array 44, an aperture array 45, and a second imaging optical system 46 arranged in a path along which the modulated exposure beam 5 passes.

The first imaging optical system 42 may be a double telecentric optical system that forms an image which has passed through the light modulator 30 on an aperture plane of the micro-lens array 44, by quadrupling the image for example. The second imaging optical system 46 may also be a double telecentric optical system that forms a plurality of beam spots formed at a focal plane of the micro-lens array 44 by, for example, a factor of approximately 1 on the substrate 80. Although it is described in the present example embodiments that the first imaging optical system 42 and the second imaging optical system 46 may respectively have magnifying powers of 4 and 1, example embodiments are not limited thereto, and a desired (or, alternatively, an optimal) combination of magnifying powers of the first imaging optical system 42 and the second imaging optical system 46 may be derived according to desired beam spot size, minimum feature size of a pattern to be exposed, and the number of exposure heads to be used in a lithographic apparatus.

The micro-lens array 44 may be a two-dimensional array including a plurality of micro lenses corresponding to the micro-mirrors of the light modulator 30. For example, when the light modulator 30 is made of 1024×768 micro-mirrors, the micro-lenses may also be arranged into the same number correspondingly, that is, 1024×768 micro-lenses. The micro-lenses may be arranged at a pitch substantially equal to a value obtained by multiplying a pitch of micro-mirrors in the light modulator 30 by the magnifying power of the first imaging optical system 42.

The aperture array 45 may be a two-dimensional array including a plurality of pinholes arranged in correspondence to the micro lenses, the pinholes being arranged at focal planes of the micro-lenses, and may be used as needed. The pinholes may serve to shape a beam spot focused through the micro lenses to a specific size or block noise generated in the optical system.

The slit 50 may pass a part of a beam spot array 100 passed through the exposure optical system 40 and enable the part of the beam spot array 100 to be irradiated onto the sensor 60. More specifically, the slit 50 may pass a beam spot line $100n$ positioned in nth row of the beam spot array 100.

The slit 50 may be, for example, glass coated with chrome, or a metal plate, but the example embodiments are not limited thereto. That is, the slit 50 may be formed into any shape that can select and pass a part of the rows of the beam spot array 100.

The slit 50 may have grooves 51 formed therein to have a width of, for example, approximately 500 μm.

If the width of the groove 51 is too wide, an error may occur due to other beam spots adjacent to the beam spot line 100n. That is, beam spots excluding the beam spot line 100n in the nth row may be switched off, but the amount of light of the switched off beam spots may not be perfectly zero. In this case, if the width of the groove 51 is too wide, beam spots excluding the beam spot line 100n in the nth row may be irradiated to the sensor. This may cause a slight inaccuracy in measuring an accumulated amount of light of beam spots.

If the width of the groove 51 is too narrow, the level of difficulty in controlling an operation of the stage 70 to put the row of the beam spot array at the position to be measured may become higher.

The slit 50 may be positioned at the height equal to the height of an upper surface 81 of the substrate 80 from the stage 70. The beam spot array which has passed through the exposure optical system 40 may be set in such a manner that the focus of the beam spot array can be formed on the upper surface 81 of the substrate 80 disposed on the chuck 90. Thus, the slit 50 and the upper surface 81 of the substrate 80 may be positioned at the equal height such that the beam spot array 100 may be focused at the slit 50 and grooves 51 provided to measure an accumulated amount of light of the beam spot array 100.

The slit 50 may be disposed above the stage 70 through a fixing unit 55. Thus, the slit 50 moves when the stage 70 moves so as to enable the beam spot array 100 to be measured on a per-row basis.

The optical sensor 60 may be disposed on the stage 70 so as to sense an optical signal of the beam spot line 100n in the nth row of the beam spot array 100 which has passed through the slit 50. The optical sensor 60 may be, for example, a photo diode or a charge coupled device. It is assumed hereinafter that the optical sensor 60 is a photo diode.

The stage 70 may include the optical sensor 60 and the chuck 90 on which the substrate 80 is disposed. The stage 70 may move in a width direction, a lengthwise direction and/or a height direction thereof by a driving unit (not shown). The stage 70 moves by the driving unit to measure an amount of light of the beam spot lines in sequence, thereby measuring an accumulated amount of light of the beam spot array 100.

The maskless lithographic apparatus 1 may include a processor and a memory (not shown).

The memory may include may include a non-transitory computer readable medium. Examples of non-transitory computer-readable media include magnetic media such as hard disks, floppy disks, and magnetic tape; optical media such as CD ROM discs and DVDs, magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The processor may be an arithmetic logic unit, a digital signal processor, a microcomputer, a field programmable array, a programmable logic unit, a microprocessor or any other device capable of responding to and executing instructions in a defined manner.

The memory may contain computer readable code that, when executed by the processor, configures the processor as a special purpose computer to perform the operations of a measuring unit 65 and a comparing unit 66, discussed in more detail below. Further, the computer readable code, when executed, may configure the processor to instruct the driving unit to move the stage 70.

For example, the computer readable code, when executed, may configure the processor to measure an accumulated amount of the light of the part of the beam spot array 100n sensed by the sensor 60 on a row-by-row basis by instructing the driving unit to move the stage 70 and the slit 50 connected thereto to incrementally switch the selected one of the plurality of rows of the beam spot array 100n and disabling non-selected ones of the plurality of rows of the beam spot array 100n, and to determine which of the plurality of rows is a defective row based on the accumulated amount of the light and a reference value stored, for example, in the memory.

Figure 4:
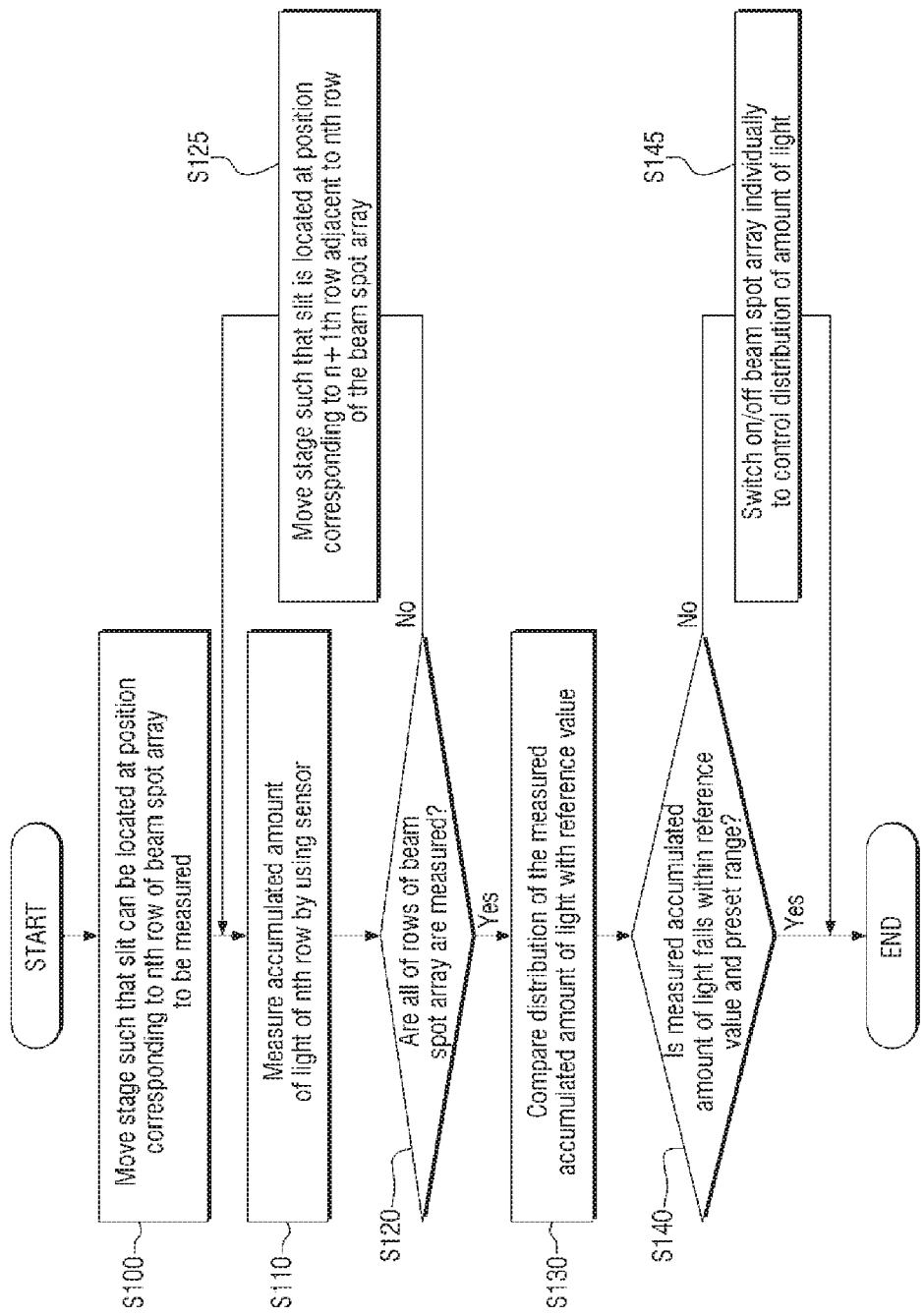
FIG. 4 is a flowchart illustrating a method of operating the maskless lithographic apparatus according to one example embodiment of the present inventive concepts.

FIG. 4 is a flowchart illustrating a method of measuring an accumulated amount of light using the maskless lithographic apparatus according to an example embodiment of the present inventive concepts.

Referring to FIG. 4, in a method of measuring an accumulated amount of light using the maskless lithographic apparatus 1 according to an example embodiment of the present inventive concepts, in operation S110, the driving unit may move the stage 70 such that the slit 50 can be located at the position corresponding to the nth row of the beam spot array 100.

In operation S110, the optical sensor 60 may measure an accumulated amount of light of the nth row by using the sensor 60.

In operation S120, the masking lithographic apparatus 1 may determine whether all of the rows of the beam spot array 100 are measured.

In operation S130, the maskless lithographic apparatus 1, for example, a processor configured to perform the functions of a comparing unit 66, may compare a distribution of the measured accumulated amount of light with a reference value.

In operation S140, the maskless lithographic apparatus 1 may determine whether the measured accumulated amount of light falls within the reference value and a preset range (S140).

Figure 5:
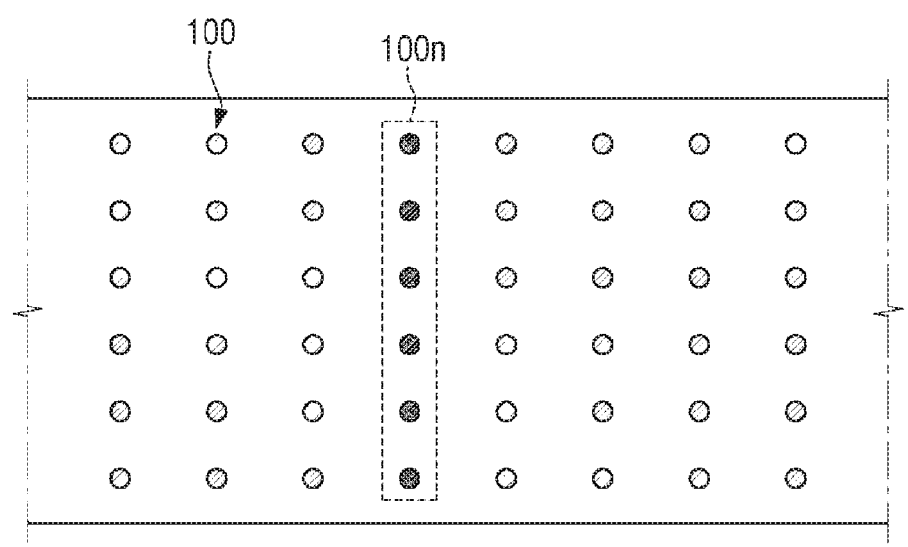
FIG. 5, FIG. 6A, and FIG. 6B are diagrams illustrating intermediate process steps of the method of operating the maskless lithographic apparatus according to one example embodiment of the present inventive concepts.
Figure 6A:
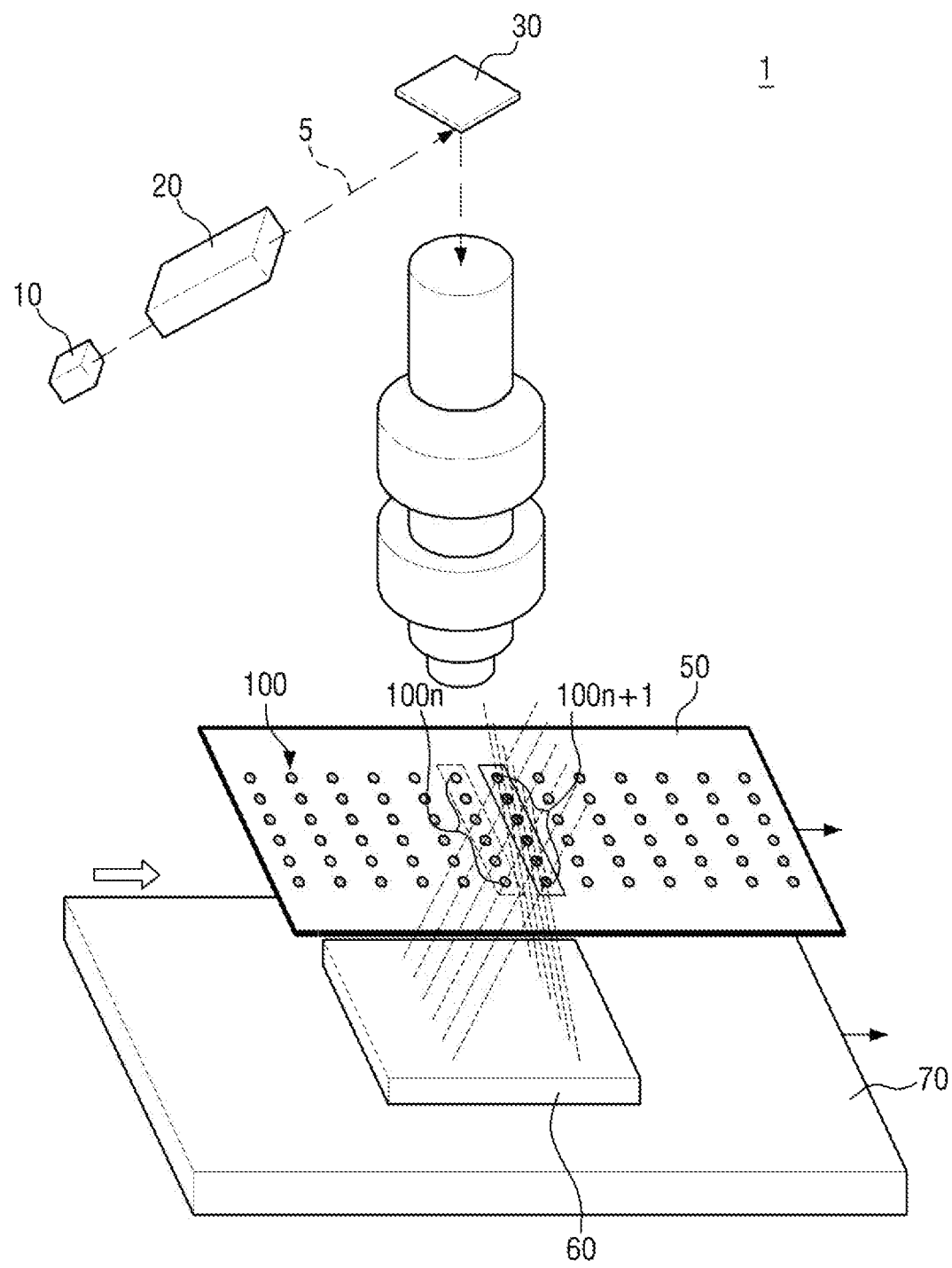
Figure 6B:
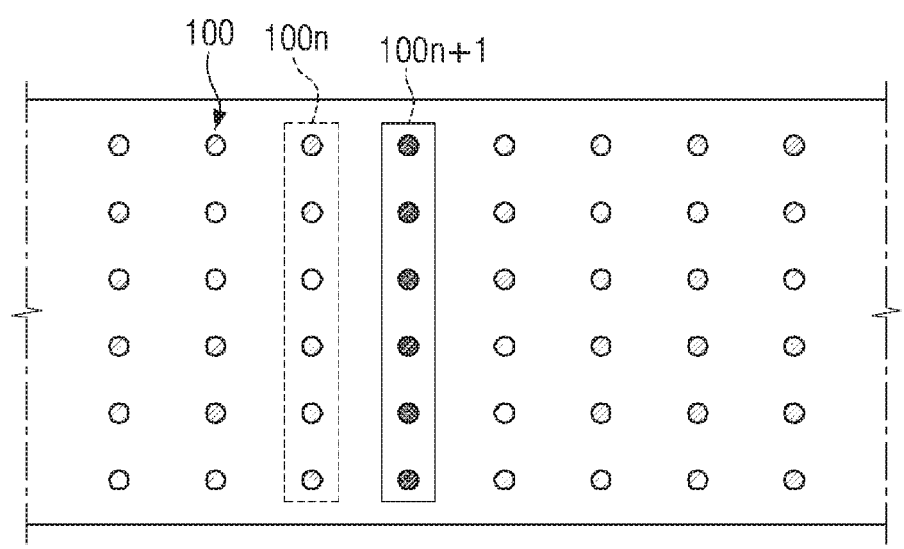

FIG. 5, FIG. 6A, and FIG. 6B are diagrams illustrating intermediate process operations of the method of operating the maskless lithographic apparatus according to an example embodiment of the present inventive concepts.

Referring to FIG. 1, FIG. 4, and FIG. 5, in operation S100, the maskless lithographic apparatus 1 may move the stage 70 such that the slit 50 can be located at the position corresponding to the nth row 100n of the beam spot array 100 to be measured.

As described above, the slit 50 is fixed by the fixing unit 55 provided over the stage 70, and thus the slit 50 may be located to correspond to the beam spot line 100n positioned in the nth row of the beam spot array 100 as the stage 70 moves in operation S100.

As the slit 50 moves to the position corresponding to the beam spot line 100n, the beam spot line 100n positioned in the nth row of the beam spot array 100 may pass through the slit 50 so as to be irradiated to the optical sensor 60.

In this case, the beam spot lines of the beam spot array 100, excluding the beam spot line 100n, may be switched off so as to prevent optical signals of the beam spot lines excluding the beam spot line 100n positioned in the nth row of the beam spot array 100 from being irradiated to the optical sensor 60. Switching off the beam spot lines of the beam spot array 100 may be adjusting an angle between the micro-mirrors in the light modulator 30 and a surface of the substrate.

In operation S110, the optical sensor 60 may measure an accumulated amount of light of the beam spot line 100n positioned in the nth row of the beam spot array 100.

For example, the optical sensor 60 may sense the beam spot line 100n which has passed through the slit 50, and a measuring unit 65 may measure an accumulated amount of light of the beam spot line 100n irradiated to the optical sensor 60.

Subsequently, in operation S120, the masking lithographic apparatus 1 may determine whether all of the rows of the beam spot array 100 are measured.

In operation S120, the masking lithographic apparatus 1 may move the stage 70 such that the slit 50 can be located at the position corresponding to n+1th row adjacent to the nth row of the beam spot array 100 if the measurement has not been completed.

In operation S130, the masking lithographic apparatus 1, for example, a processor configured to perform the functions of the comparing unit 66, may compare a distribution of the measured accumulated amount of light with a reference value if the measurement has been completed.

Referring to FIG. 6A and FIG. 6B, the slit 50 and the stage 70 may move so as to measure a beam spot line 100n+1 positioned in the n+1th row of the beam spot array 100. That is, the stage 70 may enable the grooves 51 of the slit 50 to be positioned to correspond to the beam spot line 100n+1 positioned in the n+1th row of the beam spot array 100.

As shown in FIG. 6A and FIG. 6B, the beam spot line 100n+1 positioned in the n+1th row of the beam spot array 100 may be adjacent to the nth beam spot line 100n positioned in nth row of the beam spot array 100.

Then, the optical sensor 60 may receive an optical signal of the beam spot line 100n+1 in the n+1th row of the beam spot array 100 which has passed through the slit 50, and the measuring unit 65 may measure an accumulated amount of light of the beam spot line 100n+1 in the n+1th row of the beam spot array 100.

Measuring an amount of light of beam spots by individually switching on/off all beam spots in the beam spot array may be time consuming. When a long time is spent on measuring an amount of all beam spots, other environment variables may be involved in the measurement process, which may cause a change in the amount of light of the beam spot array.

Furthermore, noises may occur since lights of the switched-off beam spots around one beam spot to be measured may not be perfectly blocked, and thus the measured beam spot may have low signal-to-noise ratio (SNR), which may cause inaccuracy in the measurement value.

The method of measuring an amount of quantity of the beam spot array by using the maskless lithographic apparatus of the example embodiments of the present inventive concepts are capable of measuring an accumulated amount of light of the group of the beam spot array in a row direction at a time, thereby shortening the time taken for measurement.

When measuring an accumulated amount of light of the beam spot line 100n positioned in nth row of the beam spot array 100, an error caused by the noises from an adjacent beam spot line may be smaller than an influence caused by the noises introduced from the surroundings of one beam spot. This enables high SNR with improved accuracy in the measurement.

Although it has been described with reference to FIG. 6A and FIG. 6B that the maskless lithographic apparatus 1 of the example embodiments of the present inventive concepts may sequentially measure an accumulated amount of light of the beam spot lines 100n and 100n+1 adjacent to each other, the example embodiments are not limited thereto. That is, the maskless lithographic apparatus 1 of the example embodiments of the present inventive concepts may measure an accumulated amount of light of the beam spot line 100n positioned in the nth row, and then measure an accumulated amount of light of the beam spot line positioned in a n+ith row (i is an integer equal to or more than 2). That is, to improve measurement speed, an accumulated amount of light can be measured by selecting beam spot lines in nth, n+ith, n+2ith rows and so on. In this case, i can be freely selected within a range not impairing the accuracy in measuring an accumulated amount of light of beam spot lines.

Figure 7:
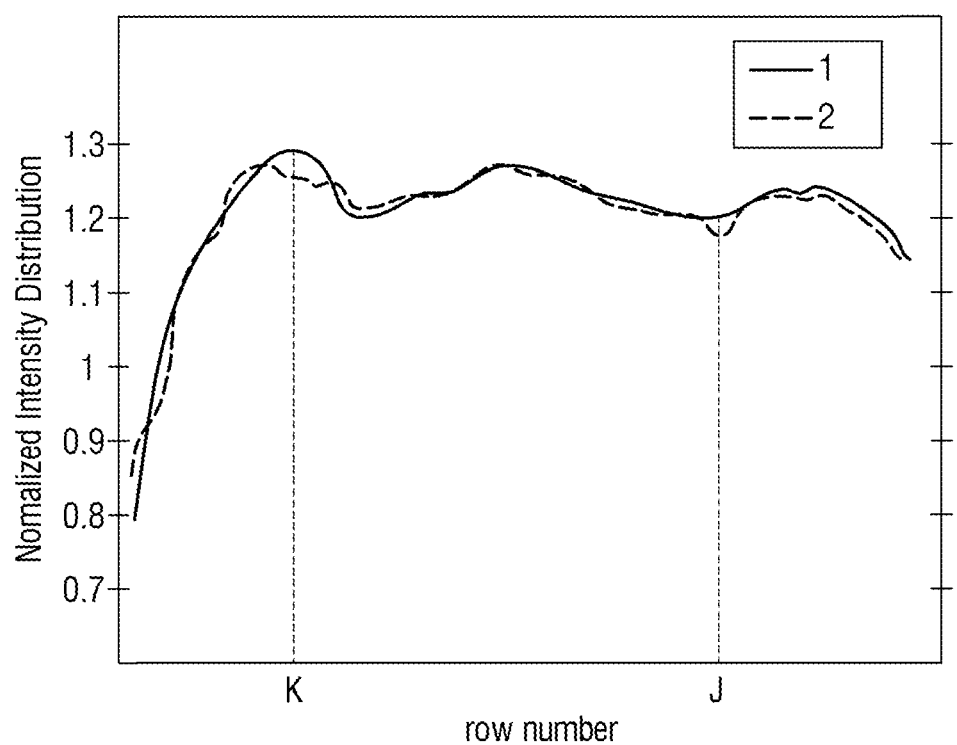
FIG. 7 is a graphical representation illustrating an accumulated amount of light measured by the maskless lithographic apparatus according to one example embodiment of the present inventive concepts.

FIG. 7 is a graphical representation illustrating an accumulated amount of light measured by the maskless lithographic apparatus according to one example embodiment of the present inventive concepts.

Referring to FIG. 7, graph 1 represents an accumulated amount of light measured by the maskless lithographic apparatus according to one embodiment of the present inventive concept, and graph 2 represents a reference value of an accumulated amount of light of a beam spot array.

In this case, the reference value of an accumulated amount of light of a beam spot array may be a desired (or, alternatively, a pre-measured) accumulated amount of light of the beam spot array.

That is, a difference between the measured accumulated amount of light of the beam spot array and the reference value, exceeding a set (or, alternatively, a preset) range, may indicate a systemic change in the lithographic apparatus caused by, for example, a degraded output of the light source or a change in the relative position between the light modulator and the micro-lens array.

If it is assumed that, when the measured accumulated amount of light of the beam spot array is compared with the reference value, a difference between the measured accumulated amount of light of the beam spot array and the reference value exists within the desired (or, alternatively, the preset) range but exceeds the range in K and J rows, beam spots in the K and J rows can be individually switched on/off to irradiate an amount of light thereof.

Since an amount of light of one row among the whole beam spot array is measured, it may take a shorter time to sense the row of which measurement value is different from the reference value, and thus the total measurement time can be shortened, providing advantages of shortened manufacturing time and improved productivity in manufacturing display devices.

The comparison between the measured accumulated amount of light of the beam spot array and the reference value may be performed by the comparing unit 66 connected to the measuring unit 65.

Figure 8:
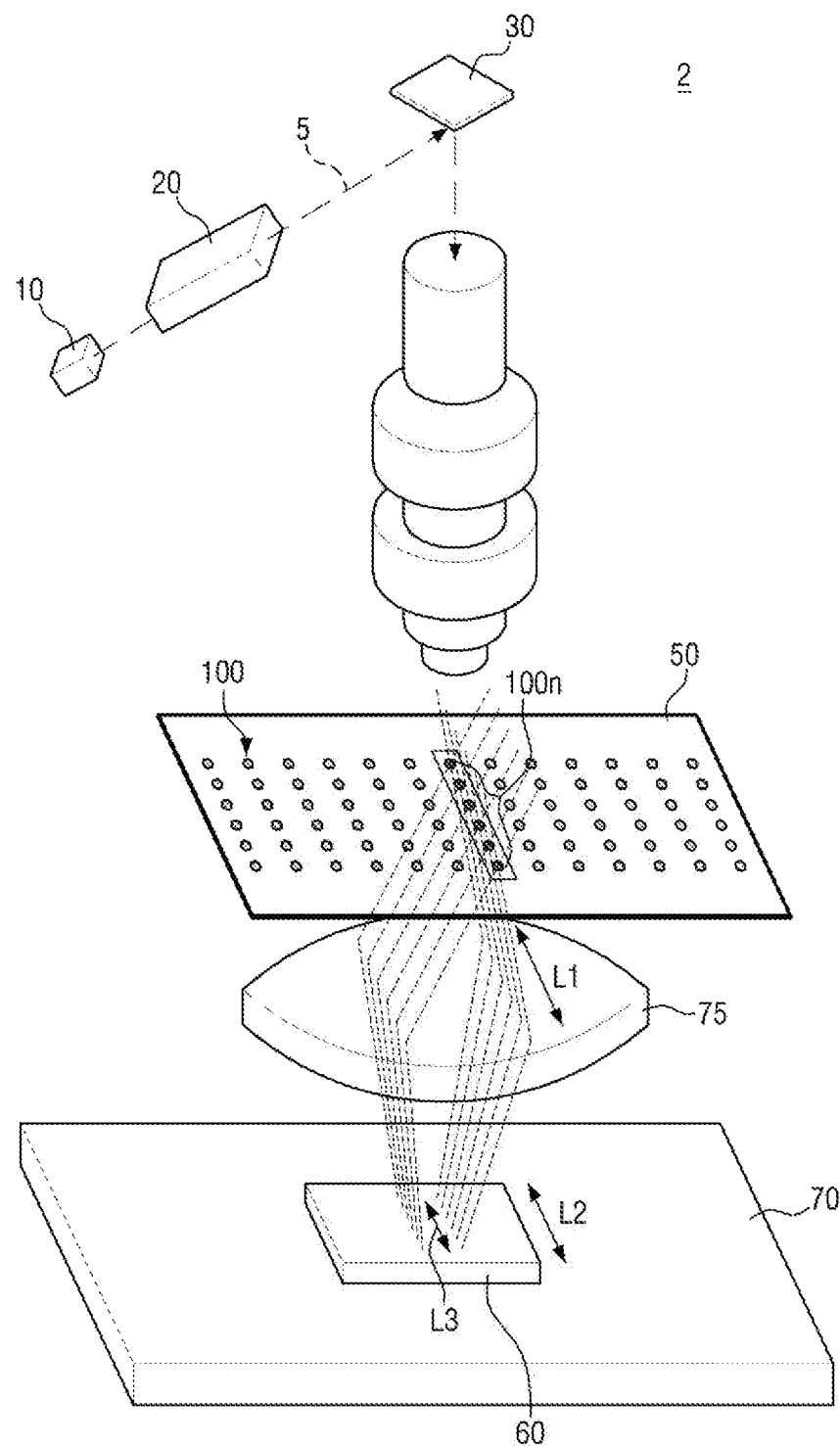
FIG. 8 is a perspective view illustrating a maskless lithographic apparatus according to another example embodiment of the present inventive concepts.

FIG. 8 is a perspective view illustrating a maskless lithographic apparatus according to another example embodiment of the present inventive concepts.

Referring to FIG. 8, a maskless lithographic apparatus 2 according to another example embodiment of the present inventive concepts may further include a lens 75 interposed between the slit 50 and the sensor 60.

The lens 75 may focus the beam spot line 100n in the nth row of the beam spot array 100 which has passed through the slit 50, and provide the focused beam spot line 100n to the optical sensor 60.

The optical sensor 60 may have a width L2 which may be narrower than a width L1 of an image formed by the beam spot line 100n which has passed through the slit 50 and meets the lens 75 or the stage 70. Thus, the lens 75 may image the beam spot line 100n on the optical sensor 60 by adjusting the magnifying power of the image formed by the beam spot line 100n.

Figure 9:
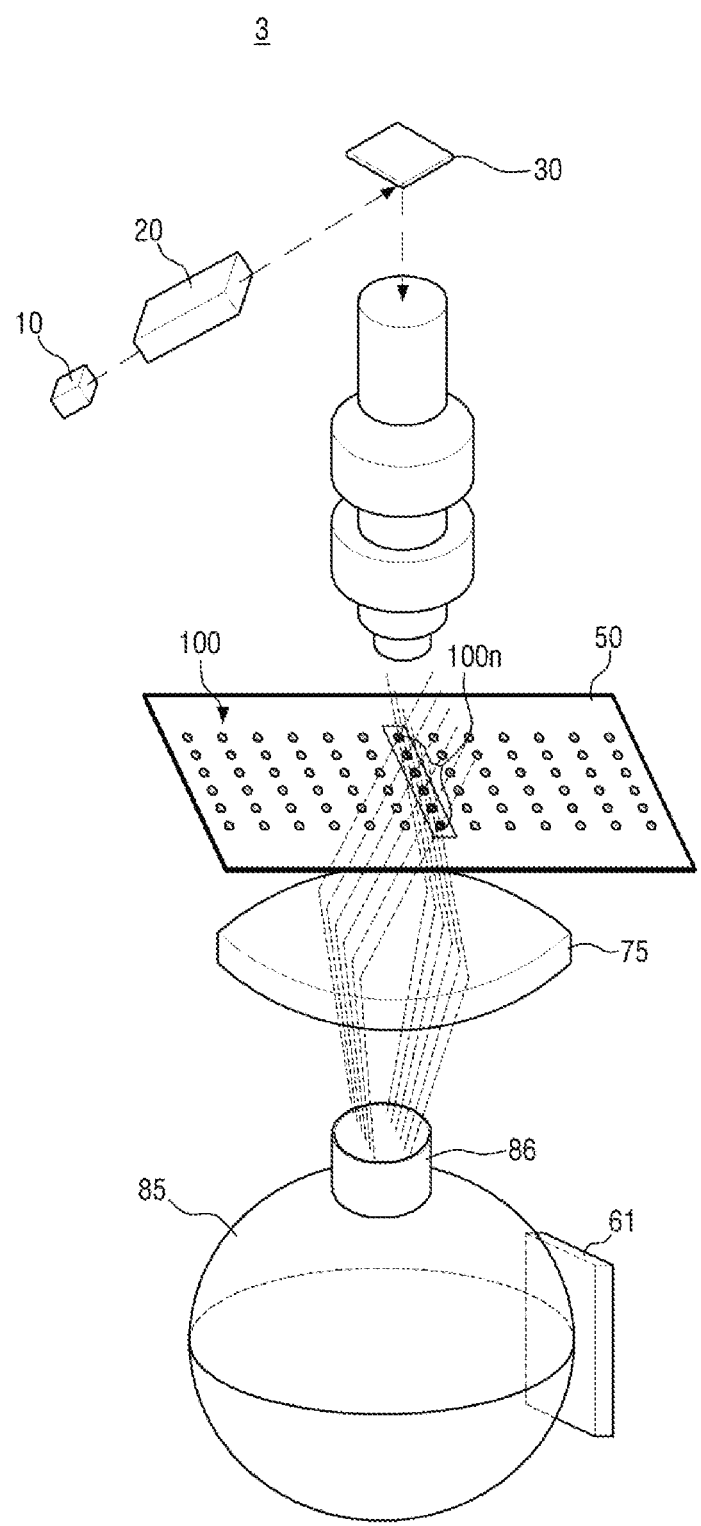
FIG. 9 is a perspective view illustrating a maskless lithographic apparatus according to still another example embodiment of the present inventive concepts.

FIG. 9 is a perspective view illustrating a maskless lithographic apparatus according to still another example embodiment of the present inventive concepts.

Referring to FIG. 9, a maskless lithographic apparatus 3 according to still another example embodiment of the present inventive concepts may further include an integrating sphere 85 for entry of the beam spot line 100n which has passed through the lens 75.

The integrating sphere 85 may include a light inlet port 86, and the beam spot line 100n which has passed through the lens 75 and imaged may enter the integrating sphere 85 through the light inlet port 86. However, the lens 75 may be omitted in the present embodiment. That is, when the light inlet port 86 of the integrating sphere 85 has a size further larger than a width of the beam spot line 100n in a lengthwise direction, which has passed through the slit 50, the lens 75 can be omitted and the integrating sphere 85 may be provided directly below the slit 50.

The optical sensor 60 may be connected to the integrating sphere 85 so as to receive the beam spot line 100n which has entered the integrating sphere 85.

The integrating sphere 85 may minimize an influence on the measurement result of an accumulated amount of light, caused by an incidence angle formed between the beam spot line 100n and an optical sensor 61 when the beam spot line 100n enters the optical sensor 61.

FIG. 10A, FIG. 10B, FIG. 11A, and FIG. 11B are diagrams illustrating intermediate process steps of the method of measuring an accumulated amount of light using the maskless lithographic apparatus according to example embodiments of the present inventive concepts.

Referring to FIG. 10A, FIG. 10B, FIG. 11A, and FIG. 11B, the plurality of optical elements LS1 to LS4 may receive input voltage Vin from the power supply 11. In this case, to measure a distribution of an accumulated amount of light generated by each of the optical elements LS1 to LS4, the input voltage Vin is supplied to the first optical element LS1 to provide first light LIGHT1 to the illumination optical system 20, while maintaining other optical elements LS2 to LS4 at a switched-off state. Thus, the exposure optical system 40 may form a beam spot array generated only by the first optical element LS1 and provide the beam spot array to the optical sensor 60.

The optical sensor 60 and the measuring unit 65 which have received the optical signal provided by the beam spot array may measure an accumulated amount of light generated by the first optical elements LS1.

The input voltage Vin may be provided sequentially to each of the second to fourth optical elements LS2 to LS4 so as to measure a distribution of an accumulated amount of light generated by each of the optical elements.

Figure 10A:
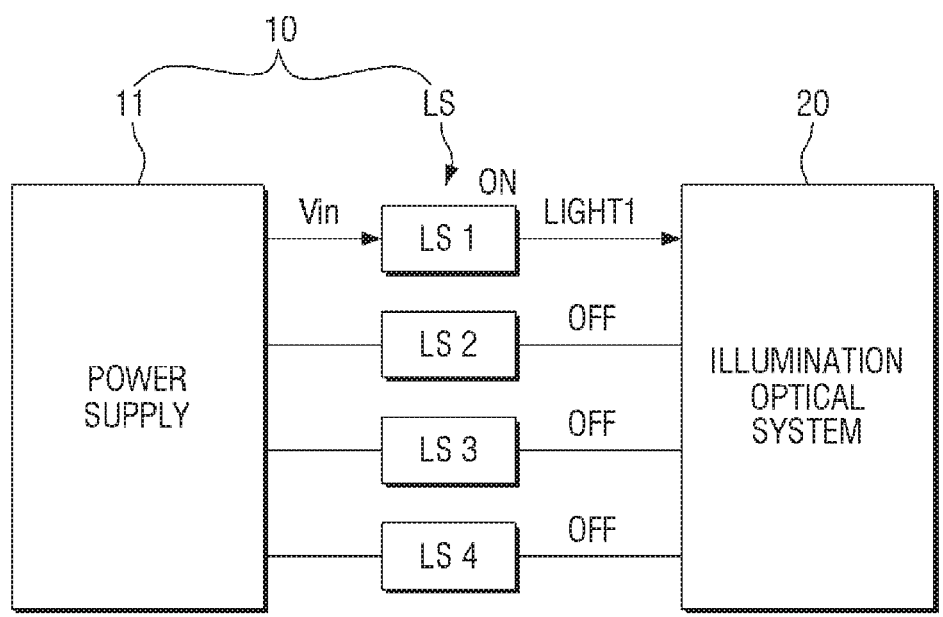
FIG. 10A, FIG. 10B, FIG. 11A, and FIG. 11B are diagrams illustrating intermediate process steps of the method of measuring an accumulated amount of light using the maskless lithographic apparatus according to example embodiments of the present inventive concepts.
Figure 10B:
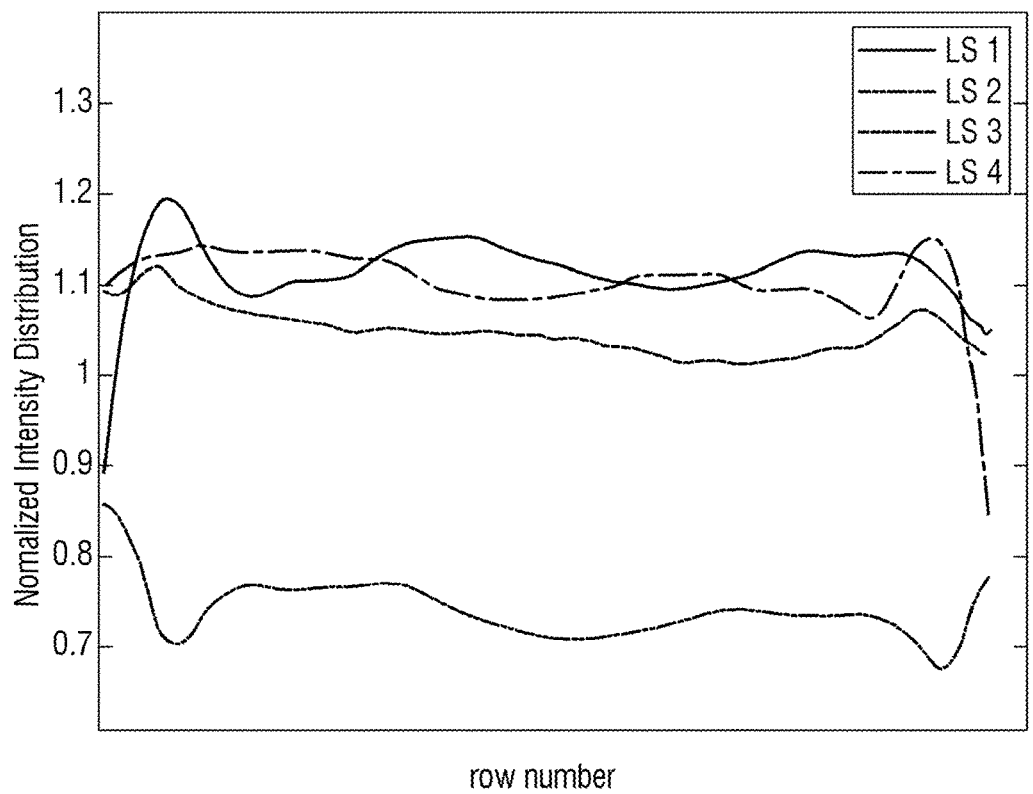

FIG. 10B illustrates an exemplary graphical representation illustrating a distribution of an accumulated amount of light measured from the beam spot array generated by the first to fourth optical elements LS1 to LS4.

A distribution of an accumulated amount of light of the beam spot array generated by the light source 10 can be calculated by adding up the distribution of an accumulated amount of light measured from the beam spot array generated by the first to fourth optical elements LS1 to LS4. This is shown in the Original graph of FIG. 11B.

Figure 11A:
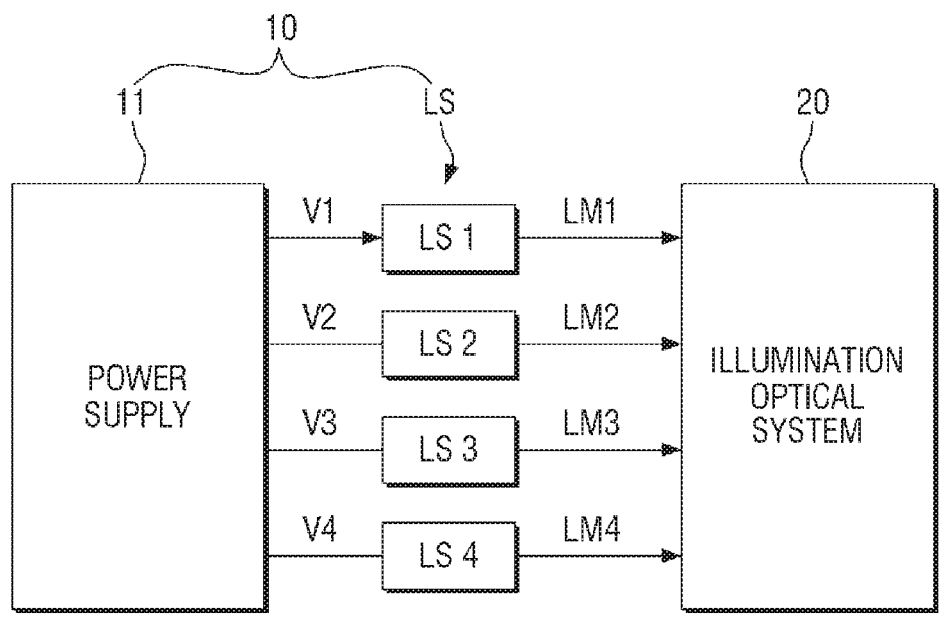
Figure 11B:
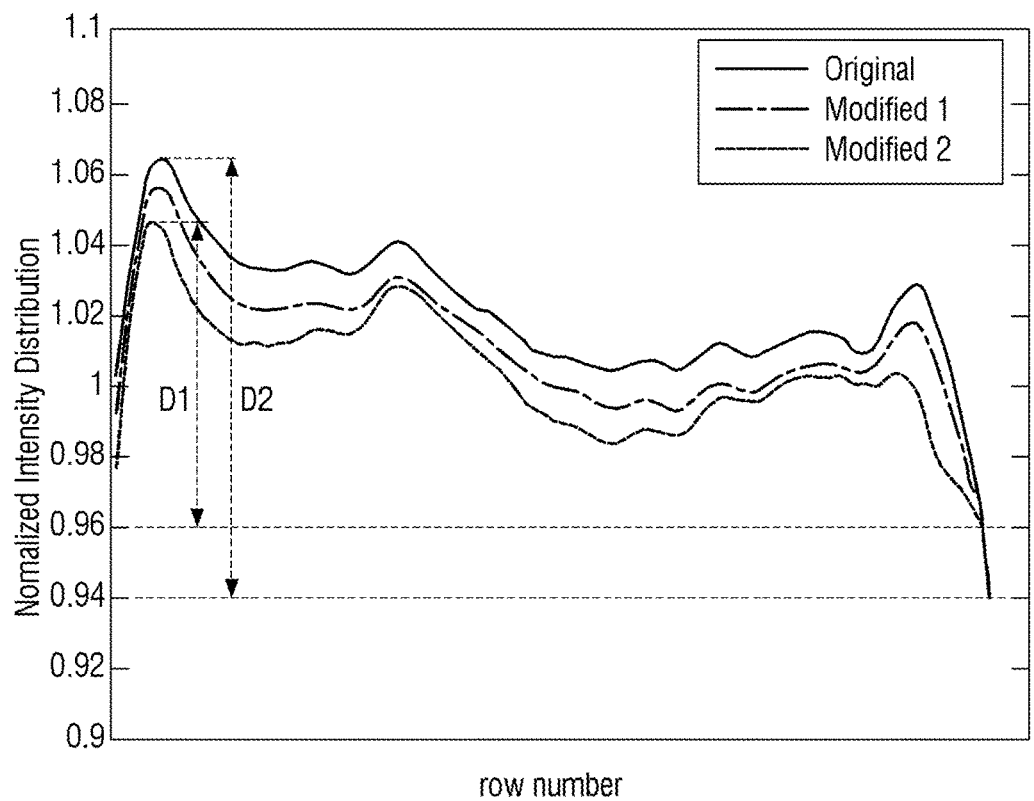

However, the distribution of an accumulated amount of light of the beam spot array generated by the light source 10 may have a deviation D2 as shown in the graph of FIG. 11B. The deviation may be involved in a deviation of an amount of light occurring at an exposure surface and may then give an influence to exposure quality.

The input voltage applied to the first to fourth optical elements LS1 to LS4 by the power supply 11 can be controlled on the basis of the distribution of an accumulated amount of light measured from the beam spot array generated by the first to fourth optical elements LS1 to LS4, thereby controlling optical output of the first to fourth optical elements LS1 to LS4. By controlling the input voltage, the distribution of the accumulated amount of light may have a reduced deviation D1.

Specifically, even when the voltage being applied to the first to fourth optical elements LS1 to LS4 changes, the distribution of an accumulated amount of light generated by the first to fourth optical elements LS1 to LS4 may be maintained and only an average value of the accumulated amount of light changes according to the voltage. Therefore, if a voltage ratio among the first to fourth optical elements LS1 to LS4 is maintained, the amount of light can be maintained constant without a change in the overall distribution of an accumulated amount of light and the distribution of an amount of light can be improved.

Graphs Modified 1 and Modified 2 in FIG. 11B show an improved distribution of an amount of light while maintaining a voltage ratio among the first to fourth optical elements LS1 to LS4.

The distribution of an amount of light can be controlled by switching on/off each beam spot of the beam spot array, but the power of the amount of light provided from the light source needs to be increased so as to acquire sufficient amount of light when the beam spot is switched off. This may cause an increase in optical loss and shortened life of the light source.

The method of measuring a distribution of an amount of light by using the maskless lithographic apparatus according to example embodiments of the present inventive concepts may improve a distribution of an accumulated amount of light through a quick measurement of the distribution of an amount of light while minimizing switching off of beam spots.

What is claimed is:

1. A maskless lithographic apparatus comprising:
    a light source configured to emit light;
    a stage configured to support a substrate;
    an optical system configured to convert the light into a beam spot array, and to irradiate the beam spot array through a slit onto the stage, the beam spot array including a plurality of columns and a plurality of rows, the slit passing an nth row of the beam spot array, n being a natural number);
    an optical sensor configured to sense the nth row of the beam spot array which has passed through the slit; and
    a measuring device including a controller configured to measure an accumulated amount of the light of a part of the beam spot array sensed by the optical sensor on a row-by-row basis by,
        measuring the accumulated amount of the light in only the nth row of the beam spot array sensed by the optical sensor,
        instructing a driving device to move the stage and the slit connected thereto to incrementally switch a selected row of the beam spot array from the nth row to an n+1th row of the beam spot array, and measuring the accumulated amount of the light in only the n+1th row of the beam spot array.

2. The maskless lithographic apparatus of claim 1, wherein the controller is configured to switch off the beam spot array excluding the n+1th row after the stage has moved to a position corresponding to the n+1th row of the beam spot array.

3. The maskless lithographic apparatus of claim 1, wherein the optical system is configured to switch off the beam spot array excluding the nth row of the beam spot array.

4. The maskless lithographic apparatus of claim 1, further comprising:
   a lens between the slit and the optical sensor, the lens configured to focus the nth row of the beam spot array passing through the slit to generate a focused nth row, and to provide the focused nth row to the optical sensor.

5. The maskless lithographic apparatus of claim 4, wherein the nth row of the beam spot array which has passed through the slit has a width in a lengthwise direction wider than a width of the sensor in a lengthwise direction.

6. The maskless lithographic apparatus of claim 4, further comprising:
   an integrating sphere configured to receive the focused nth row, and to provide the focused nth row to the optical sensor.

7. The maskless lithographic apparatus of claim 1, wherein the maskless lithographic apparatus is further configured to compare a result of measuring the accumulated amount of light in the nth row of the beam spot array with a reference value.

8. The maskless lithographic apparatus of claim 7, wherein the reference value is based on a pre-measured accumulated amount of light in the nth row of the beam spot array.

9. The maskless lithographic apparatus of claim 1, wherein the slit is at a same height as an upper surface of the substrate relative to the stage.

10. The maskless lithographic apparatus of claim 1, wherein the slit is connected and fixed to the stage.

11. A maskless lithographic apparatus comprising:
   a light source configured to provide light;
   an optical system configured to convert and output the light into a beam spot array, the beam spot array being a matrix-type beam spot array;
   a slit configured to pass a part of the beam spot array therethrough, the slit including grooves corresponding to an nth row of the beam spot array, n being a natural number;
   a sensor configured to sense the part of the beam spot array which has passed through the slit; and
   a measuring device including a controller configured to measure an accumulated amount of the light of the part of the beam spot array sensed by the sensor on a row-by-row basis by,
   measuring the accumulated amount of the light of only the part of the beam spot array sensed by the sensor,
   instructing a driving device to move the slit such that the grooves are arranged into a position corresponding to an n+1th row of the beam spot array after the measuring device measures the accumulated amount of the light of the part of the beam spot array associated with the nth row, and
   measuring the accumulated amount of the light in only the n+1th row of the beam spot array.

12. The maskless lithographic apparatus of claim 11, wherein the optical system is configured to switch off the beam spot array excluding the nth row of the beam spot array.

13. The maskless lithographic apparatus of claim 11, wherein the slit is at a same height as an upper surface of a substrate relative to a stage, the stage configured to support the substrate.

14. A maskless lithographic apparatus comprising:
   an optical system configured to convert light into a beam spot array including a plurality of rows and a plurality of columns, and to irradiate the beam spot array onto a sensor via a plate, the plate connected to a stage supporting a substrate thereon, the plate configured to pass a part of the beam spot array therethrough, the plate including grooves corresponding to a selected one of the plurality of rows of the beam spot array; and
   a processor configured to measure an accumulated amount of the light of the part of the beam spot array sensed by the sensor on a row-by-row basis by instructing a driving device to move the stage and the plate connected thereto to incrementally switch the selected one of the plurality of rows of the beam spot array and disabling non-selected ones of the plurality of rows of the beam spot array.

15. The maskless lithographic apparatus of claim 14, wherein the processor is configured to determine which of the plurality of rows is a defective row based on the accumulated amount of the light and a reference value.

16. The maskless lithographic apparatus of claim 15, further comprising:
   a plurality of optical elements configured to generate the light, wherein
   the processor is configured to determine the defective row without switching off each of the plurality of optical elements.

17. The maskless lithographic apparatus of claim 14, further comprising:
   a lens between the plate and the sensor, the lens configured to focus the selected one of the plurality of rows such that a width of the selected one of the plurality of rows is greater than a width of the sensor.

* * * * *